United States Patent [19]
Molina et al.

[11] Patent Number: 5,122,762
[45] Date of Patent: Jun. 16, 1992

[54] MICROWAVE SYNTHESIZER WITH FRACTIONAL DIVISION

[75] Inventors: Jacques Molina, Saint Denis; André Roullet, Domont; Jean-Pierre La Rosa, Garges les Gonesse, all of France

[73] Assignee: Thomson-CSF, Puteaux, France

[21] Appl. No.: 630,890

[22] Filed: Dec. 20, 1990

[30] Foreign Application Priority Data

Dec. 22, 1989 [FR] France ............................ 89 17080

[51] Int. Cl.⁵ .................. H03L 7/089; H03L 7/095; H03L 7/18
[52] U.S. Cl. ............................. 331/1 A; 307/516; 328/134; 331/17; 331/27; 331/DIG. 2
[58] Field of Search ............ 331/1 A, 16, 17, 25, 331/27, DIG. 2

[56] References Cited

U.S. PATENT DOCUMENTS 4,034,309 7/1977 Vaughn ...................... 331/1 A
4,965,531 10/1990 Riley ......................... 331/25 X

FOREIGN PATENT DOCUMENTS 0147307 7/1985 European Pat. Off. .
2021338 11/1979 United Kingdom .

Primary Examiner—Siegfried H. Grimm
Attorney, Agent, or Firm—Oblon, Spivak, McClelland, Maier & Neustadt

[57] ABSTRACT

A synthesizer including a voltage-controlled oscillator, a phase-frequency comparator, a variable-rank frequency divider, a command device to control the oscillation frequency of the voltage-controlled oscillator on a frequency which is a multiple of the frequency of the reference signal as a function of the rank of division of the variable-rank frequency divider. The phase-frequency comparator circuit sends a first series and a second series of pulses as a function of the phase advance or delay respectively of the signals applied to its first and second inputs, to charge or discharge an integration capacitor and provide a signal commanding the advance or delay of the frequency and phase of the oscillator as a function of the voltage developed at the terminals of the capacitor.

10 Claims, 11 Drawing Sheets

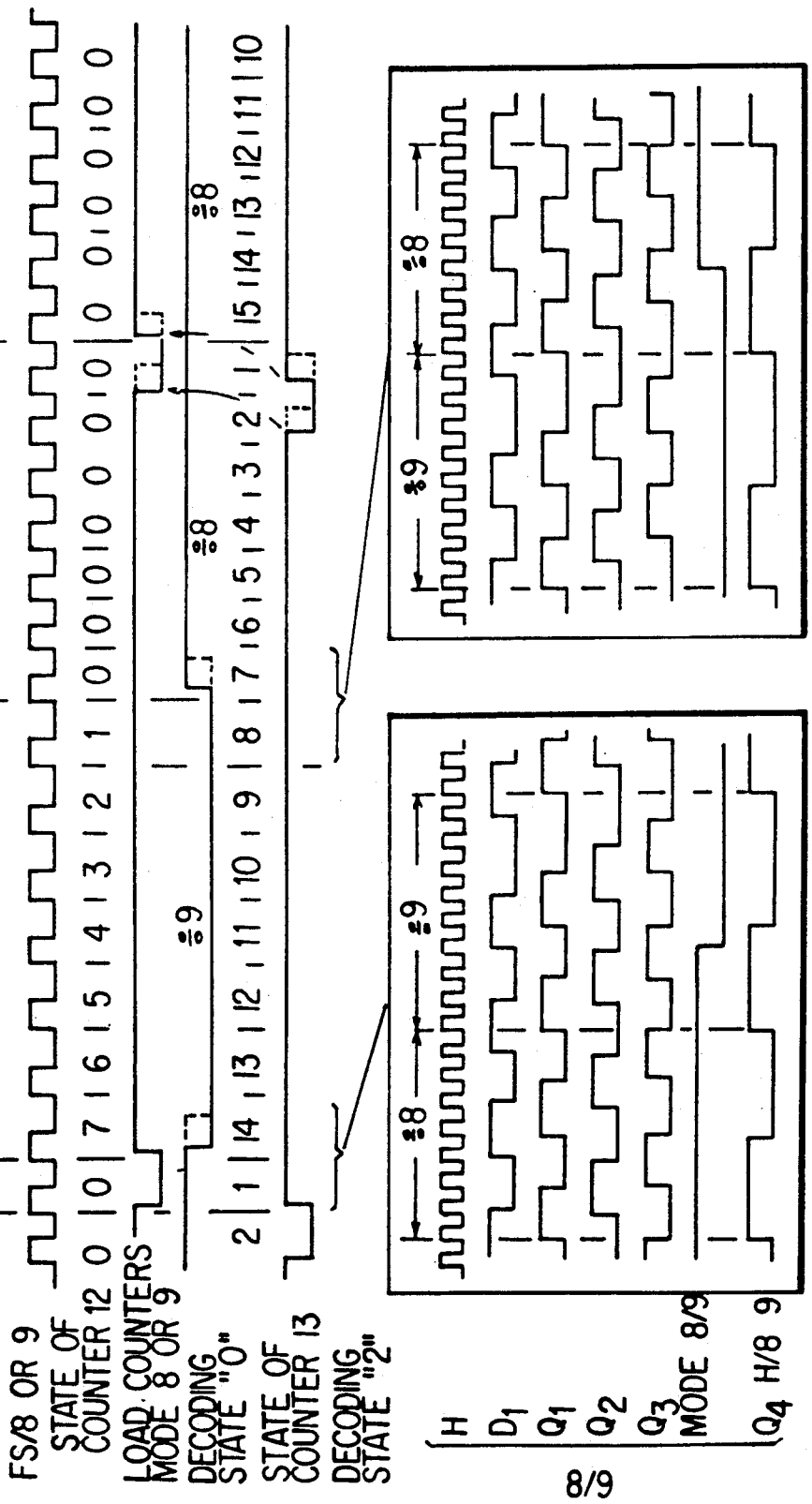

FIG. 8
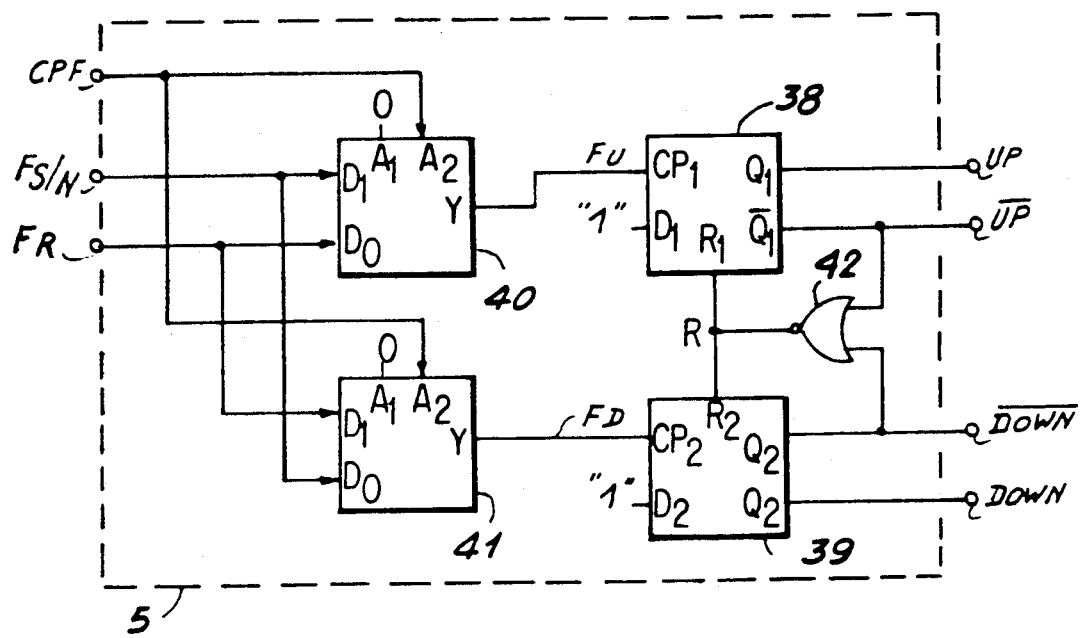
FIG. 9A
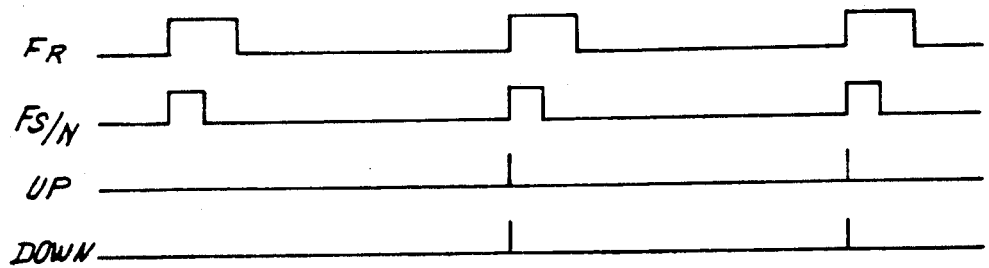
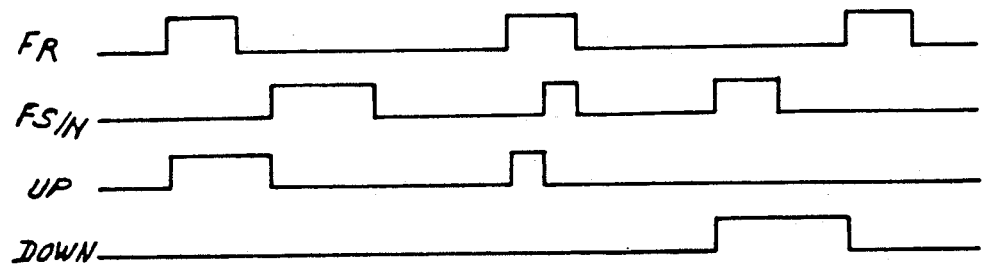
FIG. 9B

| SITUATION OF THE LOOP | OUTPUTS FROM THE PHASE COMPARATOR | | | |
|---|---|---|---|---|
| | UP | $\overline{UP}$ | DOWN | $\overline{DOWN}$ |
| EQUILIBRIUM | ⊥⊥⊥⊥ | ⊤⊤⊤⊤ | ⊥⊥⊥⊥ | ⊤⊤⊤⊤ |
| REFERENCE FR ABSENT | — | | — | |
| LOOP SIGNAL FS/N ABSENT | — | | — | |
| FREQUENCY FS IN LOW STOP | ▯▯▯▯▯ | ▯▯▯▯▯ | ⊥⊥⊥⊥ | ⊤⊤⊤⊤ |
| FREQUENCY FS IN HIGH STOP | ⊥⊥⊥⊥ | ⊤⊤⊤⊤ | ▯▯▯▯▯ | ▯▯▯▯▯ |
| ABSENCE OF FR AND OF FS/N | — | | — | |

MICROWAVE SYNTHESIZER WITH FRACTIONAL DIVISION

BACKGROUND OF THE INVENTION

The present invention concerns a microwave synthesizer with fractional division.

It applies notably to the production of synthesizers for radiocommunication systems with a high transmission rate, known as TDMA (Time division multiple access) and TACAN (Tactical Air Navigation).

Typically, TDMA synthesizers are synthesizers with a very short acquisition time of 15 μs at a step of 3 MHz, which are used for the emission and reception of information in the 1242 to 1479 MHz frequency band. TACAN synthesizers, however, are synthesizers with a slow acquisition time of 1 ms at a step of 1 MHz, which are used for the emission of information in the 1025 to 1150 MHz frequency band and for the reception of information in the 1223 to 1474 MHz band.

In the known frequency synthesizers with fractional division, the rank of division is not fixed but varies between the ranks N and N+1 according to a law calculated in real time, which gives an elementary frequency step which is a submultiple of the reference frequency. This division is generally made by considering M reference periods, during which there are F divisions by N+1 and (M−F) divisions by N. In this way an average rank of division Nm is obtained such that:

$$Nm = (F(N+1)+(M-F)N)/M = N + F/M \quad (1)$$

The synthesized frequency FS is then written as a function of the reference frequency FR:

$$FS = (N + F/M)FR = (NM + F)FR/M \quad (2)$$

This principle of synthesis introduces a cyclic phase error in the synthesizer's phase comparator, provoking a frequency modulation of the voltage controlled oscillator, and the modulation frequency is equal to the fractional frequency shift. This modulation is usually eliminated by means of an active compensation device which corrects the phase error. This device is however not applicable to the TDMA application synthesizers, for although it strongly attenuates the fractioning frequency lines, it is not compatible with the acquisition time required. If the switching time remains acceptable for a small frequency jump, this is no longer the case for larger jumps. This is due essentially to the successive saturations which occur in the loop integrating amplifier during the servo phase.

This is why the known solutions used to make these synthesizers generally use techniques of direct or indirect frequency synthesis.

A known example of a direct frequency synthesis technique whose principle is based on the switching of 4 controlled oscillators, whose frequencies are repeatedly added and divided to obtain the step required, gives a switching time of the frequencies used much less than 15 μs. However, this technique requires the use of costly and bulky components to make the frequency division and mixing circuits and the successive filters, and the many parasitic frequency lines generated by this type of device make it an unsuitable solution. For the same reasons the known principle of direct synthesis with selection and mixing of harmonics using SAW filters cannot be adopted either.

In the indirect synthesis technique a known principle of synthesis with two phase locking loops, using one "large step" and one "small step" loop with a pre-positioned oscillator and a transposition oscillator theoretically enables the acquisition time required to be obtained, but it gives a synthesizer which is too bulky and consumes too much for the applications envisaged.

SUMMARY OF THE INVENTION

The aim of the invention is to remedy the above-mentioned disadvantages.

For this purpose, the object of the invention is a microwave synthesizer with fractional division of the type comprising a voltage-controlled oscillator coupled to a first input of a phase-frequency comparator via a variable-rank frequency divider to compare the frequency and the phase of the signal given at output from the variable-rank frequency divider to the frequency and to the phase of a reference signal applied to a second input of the phase frequency comparator, a command device to control the oscillation frequency of the voltage-controlled oscillator on a frequency which is an integer or fractional multiple of the frequency FR of the reference signal as a function of the division rank of the variable-rank frequency divider and a phase accumulator circuit to command the division rank of the variable-rank frequency divider characterized by the fact that the phase comparator circuit delivers respectively at a first output UP a first series and at a second output DOWN a second series of pulses as a function respectively of the phase advance or delay of the signals applied at its first and second inputs, the two series of pulses being delivered simultaneously, in phase with each other, of the same width and in phase with the reference signal when the signals applied at the first and second inputs of the comparator are in phase and by the fact that the control device comprises an integration capacitor charged and discharged respectively by the pulses of one or the other series, to give a command signal to advance or retard the frequency and phase of the oscillator, as a function of the voltage across the terminals of the capacitor.

The advantage of the invention is that it enables a synthesizer to be made with only one phase locking loop, which is therefore reduced in bulk, and in which the choice of the reference frequency determining the acquisition speed is independent of the frequency step. Moreover, the architecture obtained is suitable for miniaturization of the synthesizer as it enables all the logical functions to be integrated on the same substrate using an ECL technique which consumes little energy and by hybriding the analog parts.

Finally, the use of a network of passive rejector circuits at the output from the phase comparator, and of a fractional divider with a low division rank provides an efficient substitute for the compensation device usually used to correct the phase error inherent in the principle of fractional division which provokes a frequency modulation of the tension-commanded oscillator.

BRIEF DESCRIPTION OF THE DRAWINGS

Other characteristics and advantages of the invention will appear hereinafter with the help of the following description made with reference to the appended drawings, which represent:

FIG. 5, a time diagram representing the operation of the variable-rank divider in FIG. 2;

FIG. 8, an embodiment of the phase frequency comparator of FIG. 1;

FIGS. 9A and 9B, two time graphs illustrating the operation of the phase frequency comparator in FIG. 8.

DESCRIPTION OF THE PREFERRED EMBODIMENTS

Figure 1:
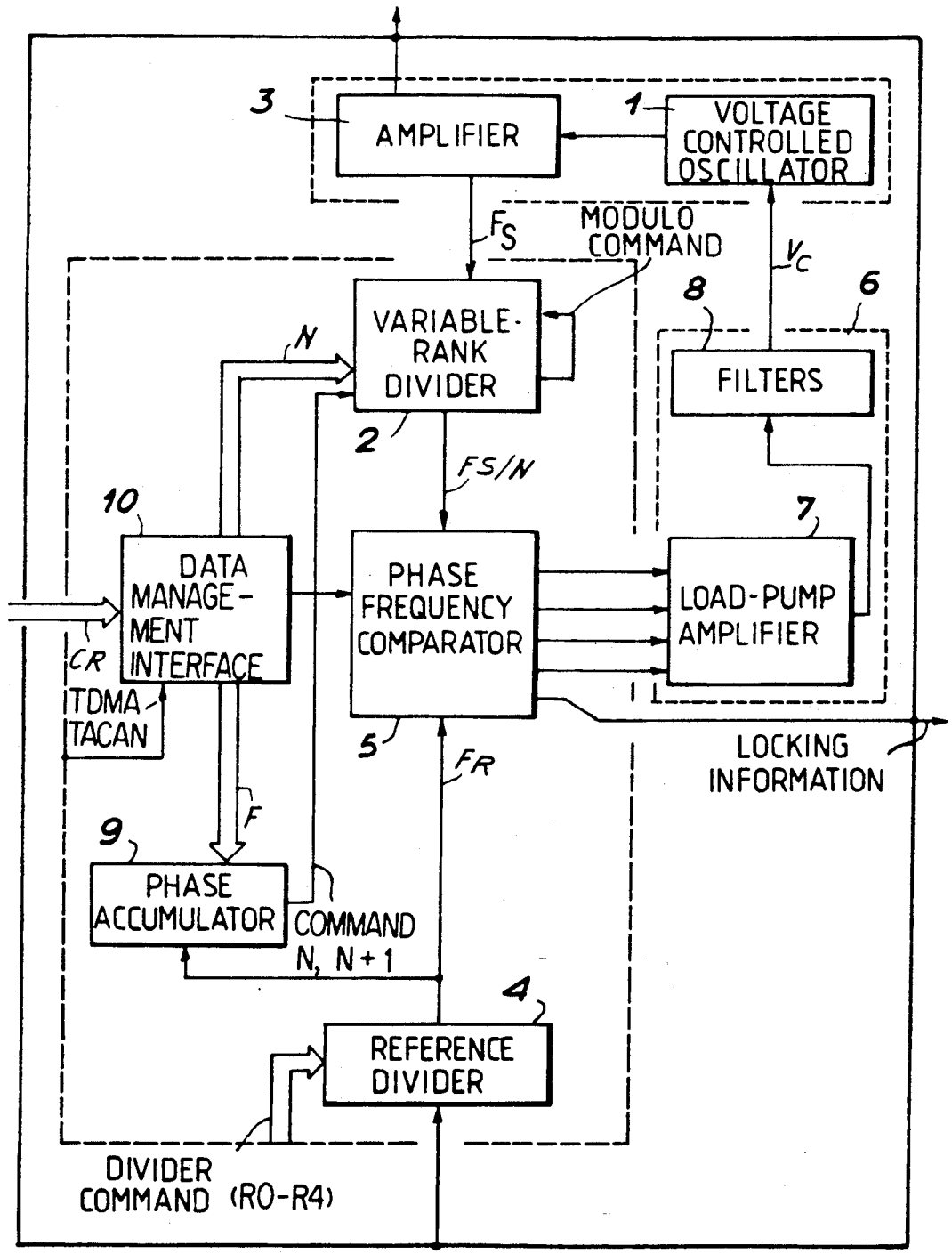
FIG. 1, a flow diagram of a synthesizer according to the invention.

The frequency synthesizer with fractional division which is represented in FIG. 1 comprises a voltage-controlled oscillator 1 coupled by its output to a variable-rank loop divider circuit 2 via separating amplifiers 3. It also includes a reference frequency divider 4, a phase-frequency comparator 5, a control device 6 composed of an amplifying circuit 7 and a loop filter 8, a phase accumulator circuit 9 and a data management interface circuit 10.

Figure 2:
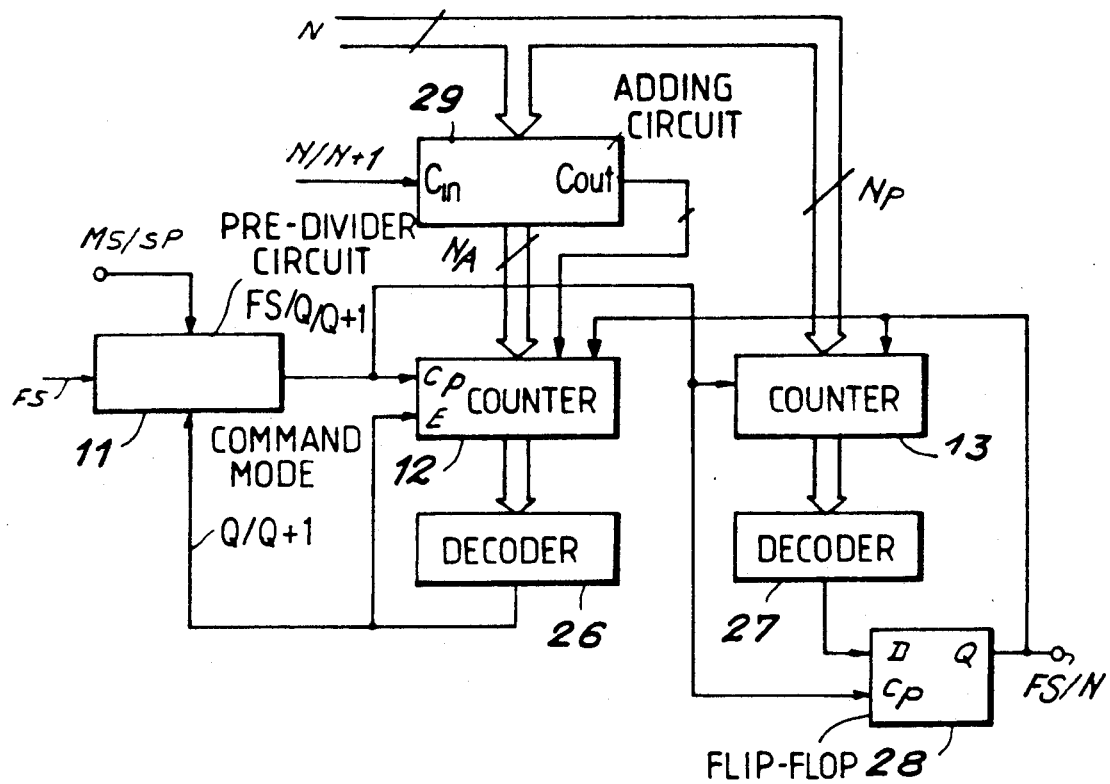
FIG. 2, an embodiment of the variable-rank divider in FIG. 1.

The variable-rank loop divider circuit 2 which is represented in FIG. 2 comprises a pre-divider circuit 11 with two modulos Q/Q+1 and two programmable synchronous counters 12 and 13 coupled to the output from the pre-divider circuit 11. The pre-divider circuit 11 comprises, in the way represented in FIG. 3, a set of flip-flops mounted in a Johnson ring in which only Q+1 states are conserved to enable the realization of a divider with two modulos Q and Q+1.

Figure 3:
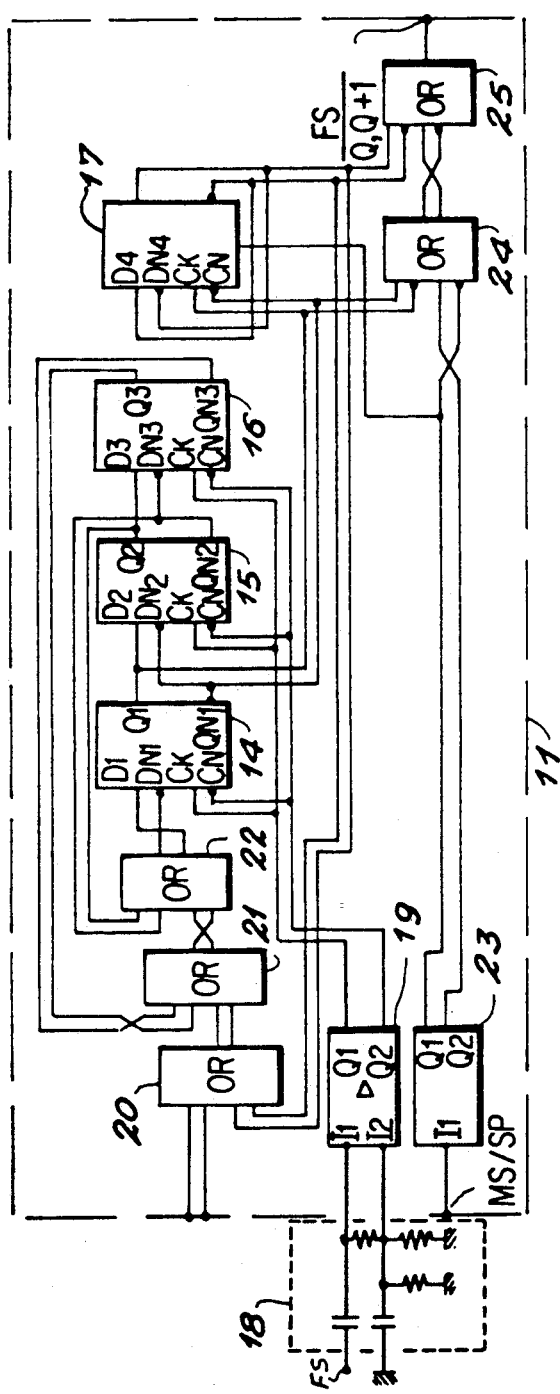
FIG. 3, an embodiment of the pre-divider in FIG. 2.

In the example in FIG. 3, the number of flip-flops is limited to 4 and the flip-flops 14 to 16 form a ring with 8 possible states. A pre-divider with two modulos 4/5 is realised using the flipflops 14, 15 and 16.

The flipflop 17 enables a double extension of the modulos to be made, i.e. a division by 8 or by 9 is possible.

The signal to be divided, provided by the output from the amplifiers (FIG. 1) is applied to the clock inputs CK of the flip-flops 14, 15 and 16 via two interface circuits 18 and 19 mounted in series. The mode of division modulo Q or Q+1 is determined by the logical "OR" circuits 20, 21 and 22 placed on the successive reloopings of the outputs of the flipflops 16, 15 and 14 on the input of the flipflop 14.

Figure 4:
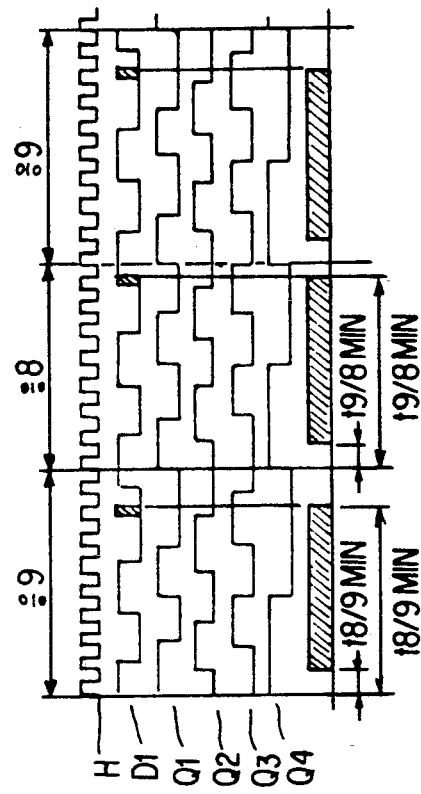
FIG. 4, a time diagram representing the operation of the pre-divider in FIG. 3.

The outputs of the pre-divider 11 are selected by "OR" circuits 24 and 25 controlled by a control bit MS/SP applied to the input of an inverter circuit 23. Thus, in division mode 4/5 the output Q1 of the first flipflop 14 constitutes the output signal of the pre-divider and the output of the last flipflop 17 is inhibited in this case. A timing diagram illustrating the operation of the pre-divider is represented in FIG. 4. This represents the successive states of the outputs Q1 to Q4 of the flip-flops 14 to 17 as a function of the states H of the frequency signal FS supplied by the oscillator in FIG. 1 through the amplifier 3.

The two counters 12 and 13 represented in FIG. 2 receive the clock signal H divided by Q or Q+1 from the pre-divider 11. These counters are programmed to the respective values NA and Np and count down simultaneously from these values, at the beginning of the cycle of division by Q+1, until the number NA is counted down to zero by the counter 12. When this occurs, the counter 12 stops counting and the division rank of the pre-divider 11 is positioned on Q by the output of a decoder 26 of the state "0" which commands the inhibition of the counter 12 (input E) and the loading of the mode of division of the pre-divider 11. At this instant there are (Q+1)×NA clock pulses counted. The countdown of the number Np by the counter 13 continues until it reaches the state "2" decoded by a decoder 27 formed by a "NOR" gate or any equivalent device placed at the output of the counter 13.

The decoding of the state 2 constitutes information of the end of the division cycle. This is synchronized with the rising edge of the output clock of the pre-divider 11 and commands the recharging of the counters 12 and 13 via a flip-flop 28, in synchronism with this clock, to the initial values NA and Np. The counter 12 is released, the pre-divider 11 is positioned to divide by Q+1 and the cycle starts again. The total number of input clock pulses H counted during a division cycle is:

$$N=(Q+1)\times NA+(Np-NA)Q=QNp+NA$$ in 8/9 mode we obtain $N=8Np+NA$ and in 4/5 mode we obtain $N=4Np+NA$ For the operation to be possible and unambiguous the relationship:

Np-NA>0 must be true, therefore Np min=NA max. With for example $0\leq NA\leq 7$, the minimum value possible for N is then: Nmin−8Npmin+NAmin=56 If the pre-divider 11 is used in 4/5 mode we would have for $0\leq NA\leq 3$, Nmin=12

A mode of sequencing the states for a division cycle corresponding to N=119 is shown in FIG. 5.

The reference divider 4 gives a reference frequency FR of the loop which is a submultiple of the external reference frequency. Its division rank is programmed by a command word of 5 bits R− to R4.

Figure 7:
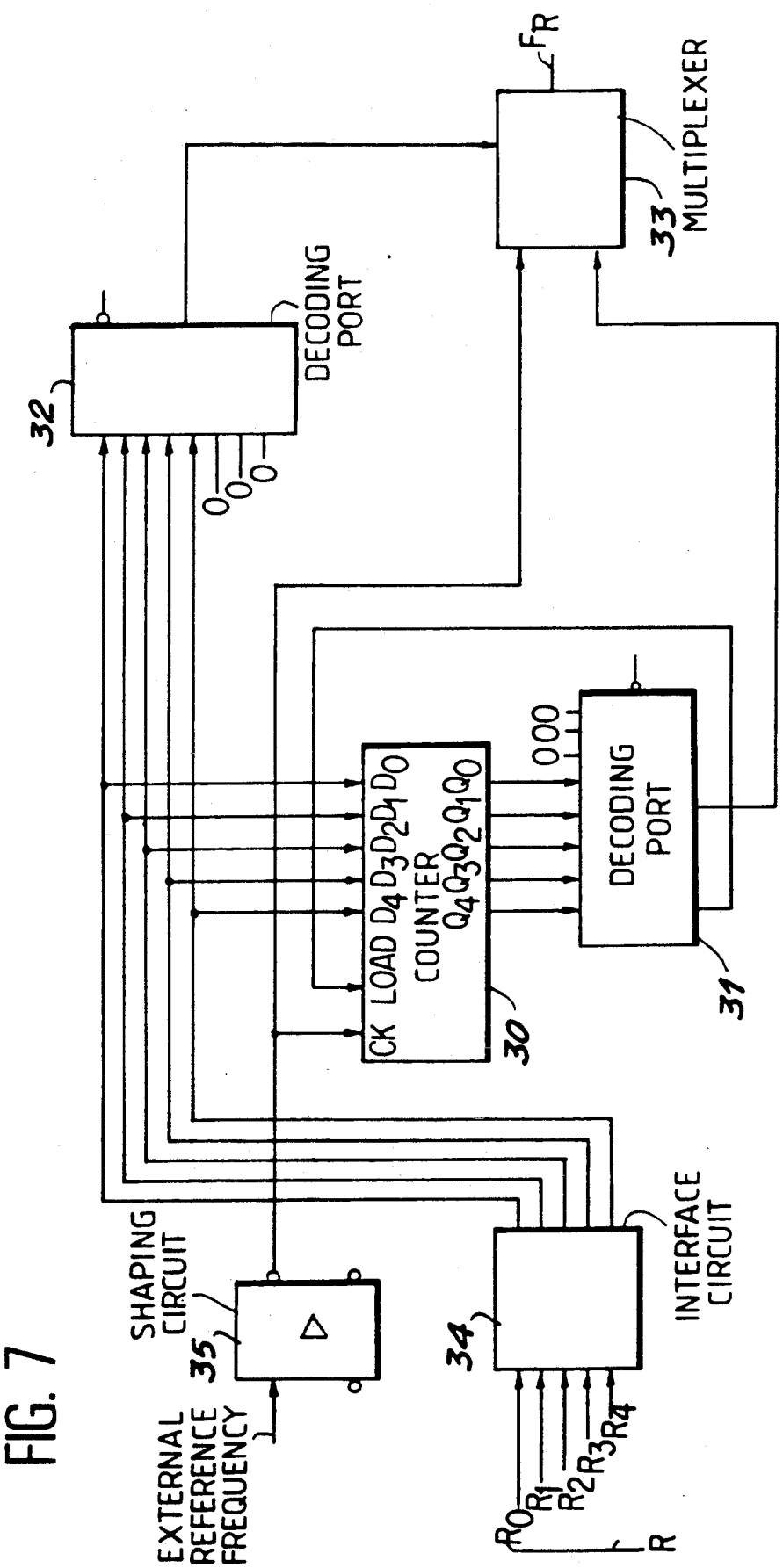
FIG. 7, an embodiment of the reference divider of FIG. 1.

The reference frequency divider is constituted as represented in FIG. 7 by a programmable 5-bit binary counter 30 which supplies all the division ranks between 2 and 32 inclusive. This circuit counts down from the value programmed on its inputs D to the value "zero", in synchronism with the rising edge of a clock signal supplied by an external reference frequency. A decoding port 31 at the output from the counter 30 detects the state "0" and sends a level "0" to the "LOAD" input of the counter 30, which authorizes its reload to the value programmed at its inputs D.

When the command R of the division rank of the reference divider 4 is equal to "0", this state is detected by a decoding port 32 via an interface circuit 34 which sends a command signal enabling the channel Do of a 2-input multiplexer to be selected. The "external reference" signal is applied to the input Do of a multiplexer 33 via a shaping circuit 35 and the output signal from the counter 30 on the input D1 of this same multiplexer 33 via the decoding port 31.

This device, when the division rank is null (R=0), gives a loop reference frequency FR equal to the external reference frequency.

For the TDMA synthesizer the reference frequency of 12 MHz is obtained after division by 2 of the external reference frequency 24 MHz. The loop reference frequency of the TACAN synthesizer is 1 MHz; this is obtained after division by 24 of this same external reference frequency.

Figure 6:
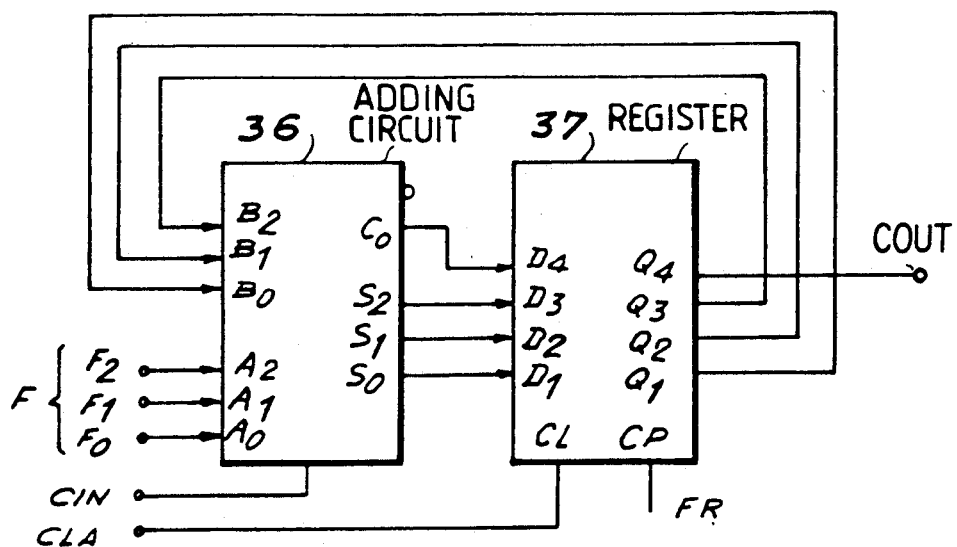
FIG. 6, an embodiment of the phase accumulator in FIG. 1.

The phase accumulator circuit 9 which is represented in FIG. 6 comprises an adding circuit 36 (3 bits) followed by a register 37 (4 bits) which enables the information obtained at output from the adding circuit 36 to be synchronized on the rising edge of the clock, at the reference frequency FR, with the overflow signal COUT of the register 37. The outputs (Q1-Q3) of the register 37 are relooped to the inputs (B0-B2) of the adding circuit 36.

The role of the phase accumulator circuit 9 is to determine the mode of division by N or by N+1 of the variable-rank loop divider circuit for each reference cycle defined by the period of the signal supplied by the reference frequency divider 5.

The modulus M of the phase accumulator circuit 4 is related to the reference frequency FR and to the stem P of the synthesizer by the relationship:

$$M = FR \cdot P$$

The synthesizer frequency command information is supplied by the division rank N used for the programming of the variable-rank divider 2 and by the fractional term F applied to the input of the phase accumulator circuit 4 which is defined following relationship (2) by the relationship:

$$F = M(FS/FR - N) \qquad (4)$$

The content of the register 37 is increased by the number F at each period 1/FR of the reference signal.

The content Pk of the accumulator register 37 is in this way equal, at the Kth clock period, to Pk=(Pk−1+F) modulo M (5).

The maximum value of Pk being M−1.

When the content of the register 37 reaches or exceeds the value M, the accumulator circuit 37 supplies an overflow signal which is applied to the carry over input CIN of the adding circuit 29 to command incrementation of the division rank N by one unit. (command N, N+1 in FIGS. 1 and 2).

The successive values of the content Pk of the accumulator register 37 correspond to the phase difference existing between the loop signal FS/N and the reference frequency FR.

The phase-frequency comparator circuit 5 measures the frequency difference between the output signal from the variable-rank divider of frequency FS/N and the frequency reference signal FR during the temporary period of control of the loop during a change in frequency.

When the loop is stabilized the comparator circuit 5 whose details of embodiment are shown FIG. 8 gives a measurement of the phase difference between the signals FS/N and FR at each reference period 1/FR.

This circuit comprises two "D type" flip-flops, 38, 39 coupled to two multiplexer circuits 40, 41. The flip-flops 38, 39 are activated on the rising edge of the clock Cp, and their outputs Q are fed back to the "Reset" inputs via a "NOR" gate 42.

During the temporary control phase of the loop there is no longer any phase relation between the signals at the input of the comparator 5, the outputs Q of the gates 38 and 39 deliver respectively a phase advance information "UP" or a phase delay information "DOWN" of one signal with respect to the other.

When the loop is stabilized, the output "UP", "DOWN" signals from the comparator 5 are constituted by a succession of very fine pulses of period equal to that of the reference signal applied to the input of the comparator. These "UP" and "DOWN" output pulses are in phase. Graphs of the corresponding operation of the comparator circuit are represented in FIGS. 9A and 9B.

As the performances of the synthesizer, notably concerning its spectral purity, are measured when the loop is locked, i.e. when the comparator operates in the neighborhood of null phase difference, the transfer characteristic of the comparator circuit 5 must be very linear in this range and without a dead zone so as to keep the gain of the phase comparator circuit 5, and thus the phase loop gain, constant.

The multiplexers 40 and 41 with 2 inputs enable permutation of the signals at the input to the comparator as a function of the command signal CPF. This device enables the direction of command of the oscillator 1 to be reversed.

Figures 10, 11:
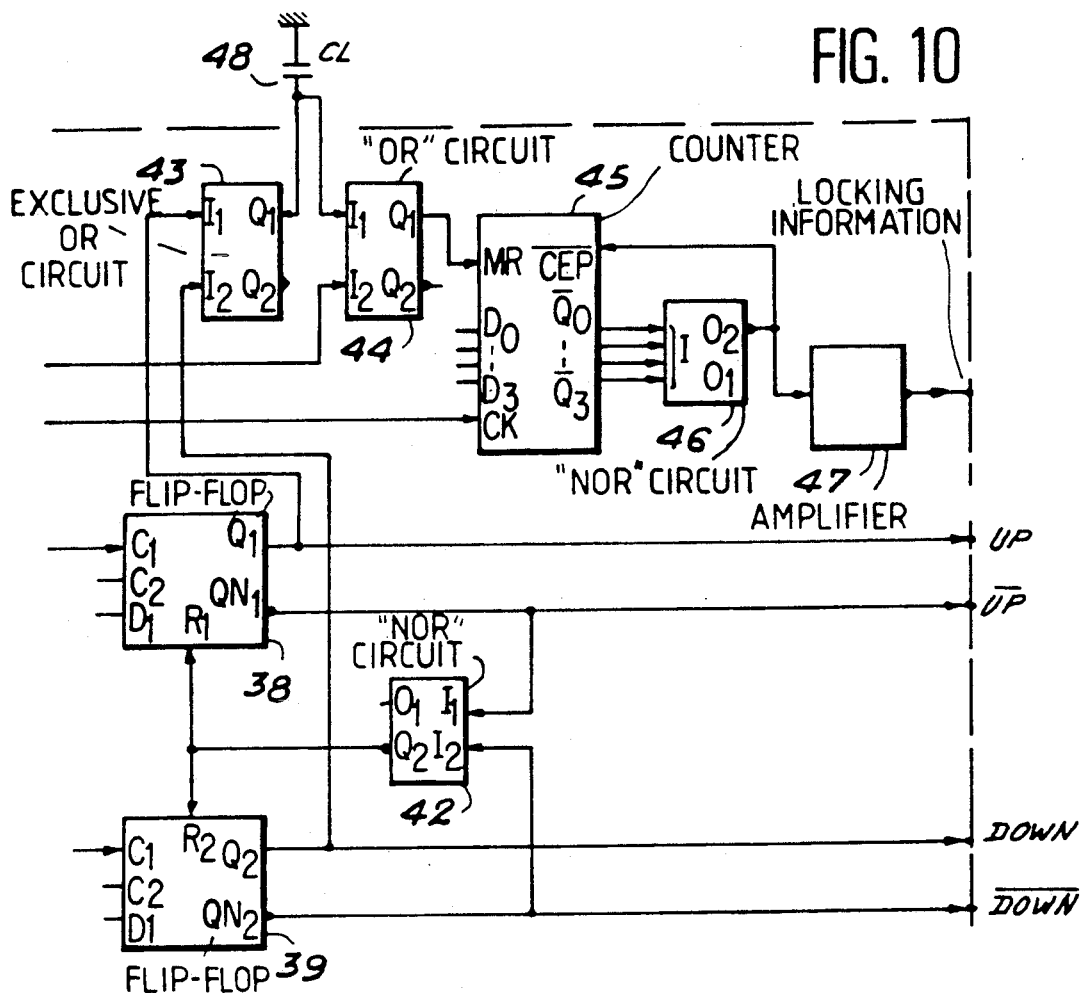
FIG. 10, an embodiment of a phase locking detection device.
FIG. 11, a table to illustrate the operation of the device in FIG. 10.

A useful addition to the phase frequency comparator circuit 5 is a loop locking detection device represented in FIG. 10 where the parts of the comparator circuit homologous with those in FIG. 8 are represented with the same reference numbers.

This device gives reliable information enabling any incorrect operation of the synthesizer to be detected. For this purpose it uses the "UP" and "DOWN" signals which appear at the output from the comparator circuit 5 and delivers a logic state "1" when the phase loop is locked, or a state "0" if it is not.

Depending on the situation of the phase loop, various signals can appear at the output of the phase-frequency comparator circuit 5. These different cases are summarized in the table in FIG. 11.

In FIG. 10 the "UP" and "DOWN" signals at output from the comparator circuit 5 are sent to the input of an "exclusive OR" circuit 43. They are constituted when the loop is not locked, either of a level "1" or of a series of "0" and "1" with a high proportion of "1". The output signal from the "OR" circuit 44 is applied at the reset input MR of a counter 45 whose clock is the reference frequency FR. When the output from the "OR" circuit 44 is in the permanent "1" state (MR=1), the outputs Q from the counter 45 which are collected together at the input of a "NOR" gate 46 deliver a state "1".

If there is a series of "1" states, the counter 45 is frequently reinitialized and presents at the output from the "NOR" circuit 46 a permanent "1" state, as in this case it has not enough time to finish the count. This state is reversed by the amplifier 47 before being sent to the output of the detection device.

When the loop is locked, the equilibrium pulses present at the outputs Q from the counter 45 are in phase and the input MR of the counter 45 passes to the "0" state. A filter 48 at the output of the "exclusive OR"

circuit 43 smooths the parasite pulses which can appear during transition of the equilibrium pulses. This filter is constituted by a condenser CL. When the input MR=0 the counter 45 counts 15 reference clock periods. At the end of the count, it gives a "0" state at output from the "NOR" circuit 46 which contains the outputs Q from the counter 45, which blocks the count (due to the relooping on the clock inhibition input CEP of the counter). This state is sent to the output of the detection system by the amplifier 47.

As for a frequency jump of small amplitude (e.g. 1 to 2 frequency steps), the loop reacts very quickly and the equilibrium pulses at output from the phase comparator 5 are not sufficiently disturbed to be detected by this device; the "OR" circuit 44 applies a signal CHF2, coming from the data management interface 10, to the input MR of the counter 45.

The role of the signal CHF2 is to trigger the counting and to indicate unlocking of the loop during the control phase.

Figure 13:
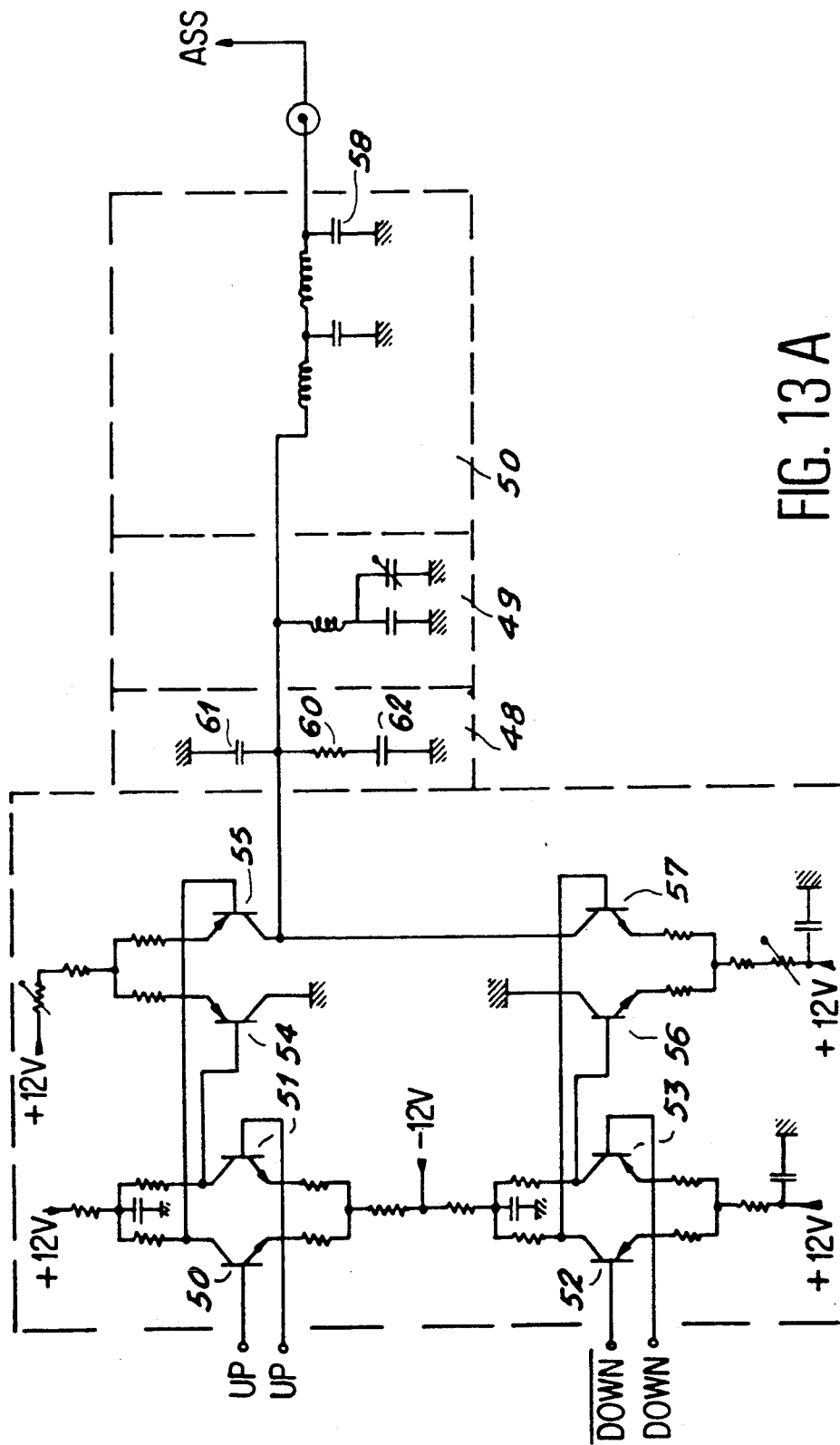
FIGS. 13A and 13B, embodiments of the load-pump amplifier and of the loop filter in FIG. 1.
Figure 13:
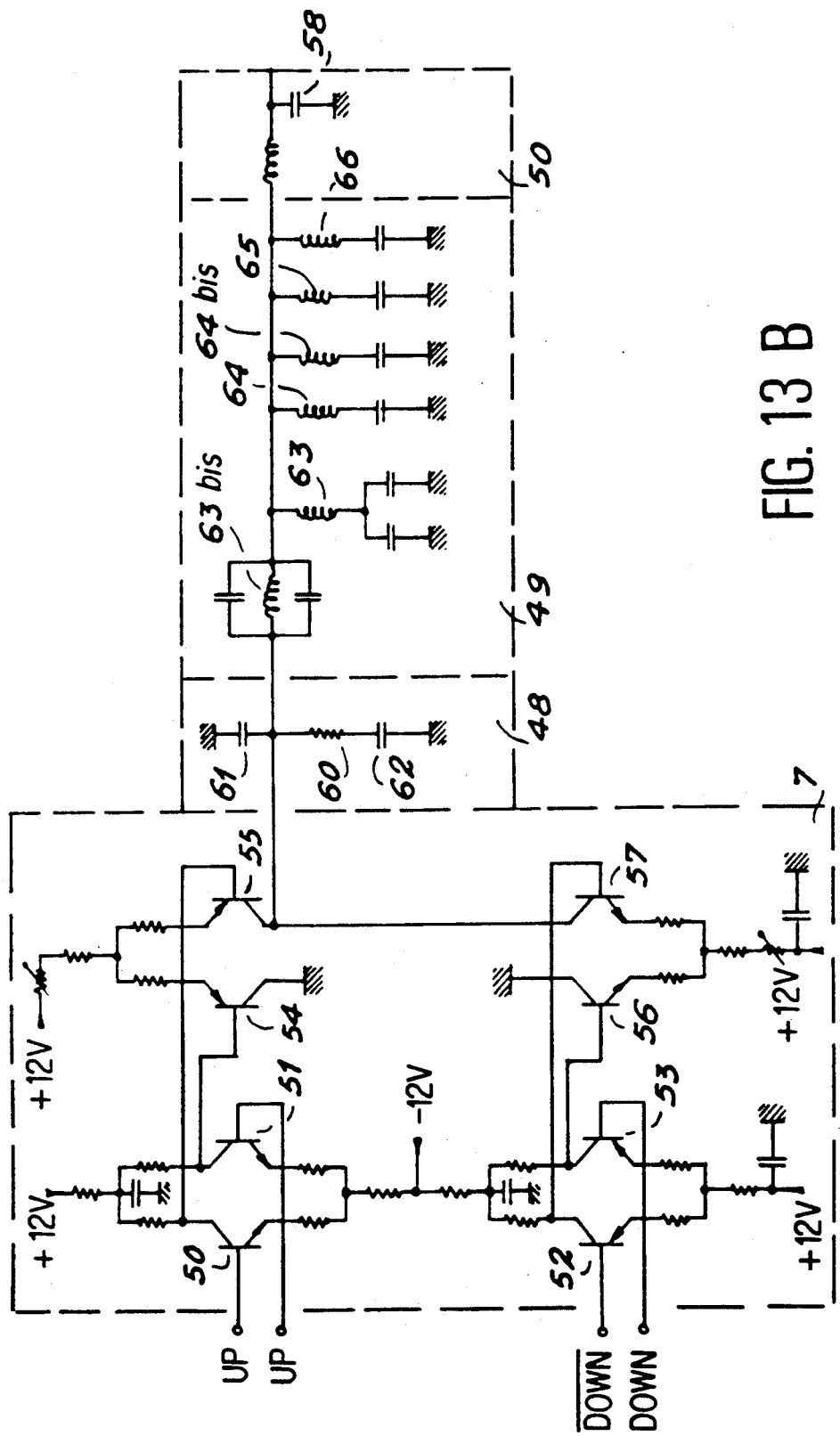

The control device, represented for the TDMA and TACAN applications in FIGS. 13A and 13B respectively, comprises a load-pump amplifier 7, coupled to loop filters 48 and rejectors 49 and to a low-pass filter 50 connected in series.

The load-pump amplifier 7 is constituted of two switched current sources IUP and IDOWN, formed by the transistors 50 to 57 which charge and discharge an integration capacitor 62. The two sources of current comprise two symmetrical channels UP and DOWN each composed of a first differential pair of transistors 50, 51 and 52, 53 respectively which performs a translation of level to command a second pair of transistors 54, 55 and 56, 57 respectively which performs the switching of the charge and/or discharge current of the integration capacitor 62. The switching command is assured by the output "UP" and "DOWN" signals and their complement supplied by the comparator 5. The speed of the commutators, each of which is constituted by a differential transistor stage, enables the fine pulses at output from the phase comparator 5 to be taken into account.

The conversion gain of the phase comparator and load-pump amplifier unit 7 is defined by the value of the output current which is optimized as a function of the loop gain and of the response speed desired.

The loop filter 48 formed by the resistance 60 and the capacitors 61 and 62 is determined in such a way as to obtain the characteristics of phase noise and acquisition time required.

As an example, a slow TACAN-type synthesizer must have a narrow loop pass band (cut-off frequency 30 KHz), and a rapid TDMA-type synthesizer must have a wide loop pass band (cut-off frequency 400 KHz).

Parasitic lines, which are multiples of the reference frequency, are eliminated using rejector filters 49 for the TACAN and 66 for the TDMA formed by resonant series circuits centered, for example, on the frequency 12 MHz for TDMA synthesizers and on 1 MHz for TACAN synthesizers.

Other lines which are harmonics of the reference frequency are filtered by the loop.

For the TDMA synthesizer, the fractioning frequency lines at frequencies which are multiples of 3 MHz are eliminated using rejector filters 63, 64, 65 centered on the frequencies of 3 MHz, 6 MHz and 9 MHz. The other harmonic lines of 3 MHz and of frequency greater than 12 MHz do not require specific filtering as they are already greatly attenuated by the loop filtering.

The lines at 3 and 6 MHz, which are those closest to the loop pass band, each require, to be brought down to a level of less than −70 dBc, two LC rejectors (a series LC wavetrap circuit 63bis followed by a parallel LC circuit to attenuate the lines at 3 MHz and two parallel circuits 64 and 64bis to attenuate the lines at 6 MHz).

Two parallel LC circuits centered at 9 MHz and 12 MHz enable the lines at these frequencies to be attenuated.

Figure 12:
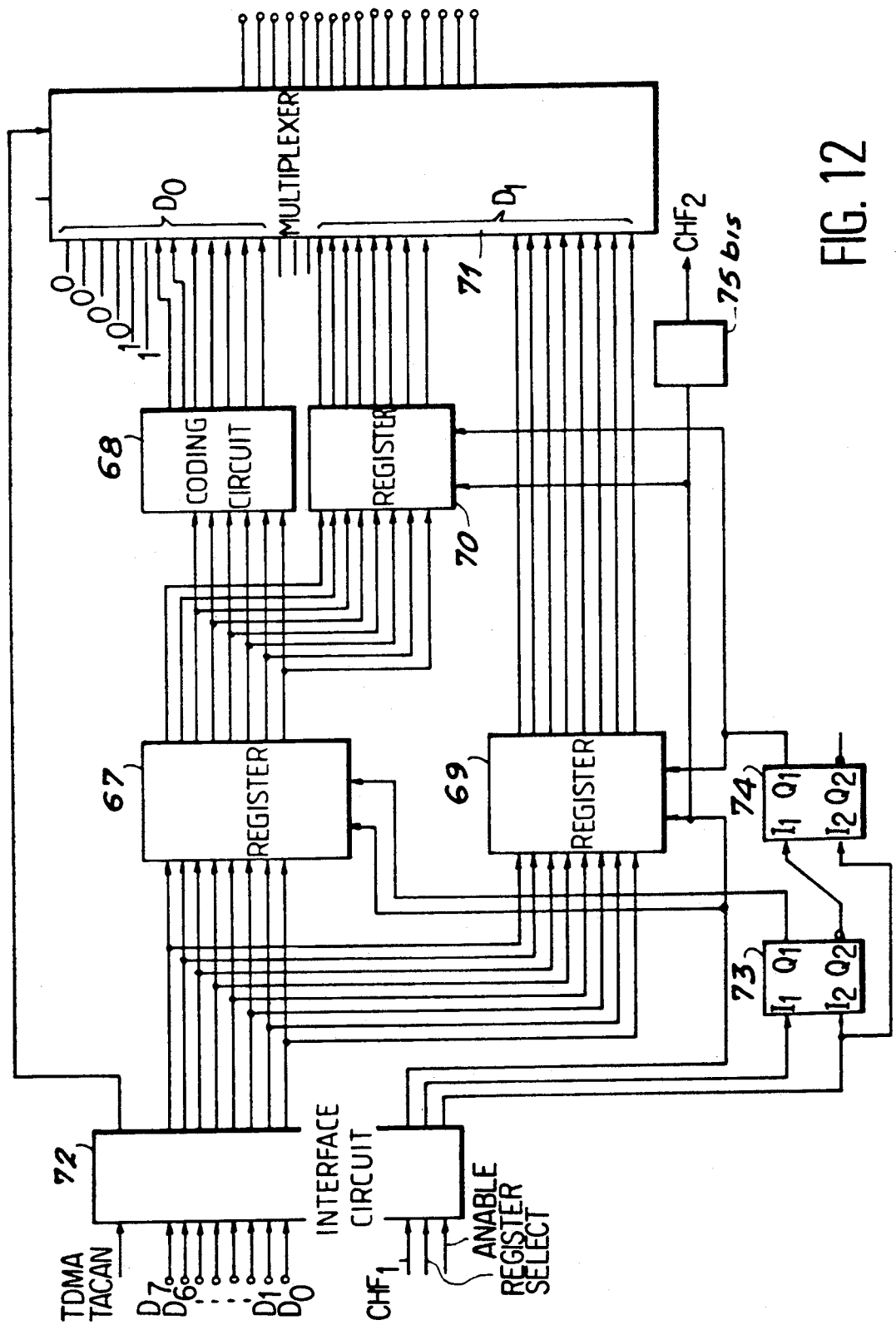
FIG. 12, an embodiment of the data management interface of the synthesizer represented in FIG. 1.

The data management interface represented in FIG. 12 manages the synthesizer command data supplied by the radio bus CR in FIG. 1, for the specific modes of operation of the TDMA and TACAN synthesizers. In this example, the command information of the TDMA synthesizer is composed of a parallel 8-bit word, 6 of these bits being used to define the number of the frequency channel (between 0 and 50) on which the synthesizer must operate.

The information is taken into account on the rising edge of the signal pulse CHF1 which constitutes the clock of a register 67 validated by the low level of the ENABLE signal.

The channel information CR is applied to an interface circuit 72 and is transformed into command information for the variable-rank divider 2 (words NA on 3 bits and Np on 8 bits in this example for programming of the counters 12 and 13 in FIG. 2) and for the phase accumulator circuit 9 (word F on 3 bits) through a coding circuit 68 connected to the register 67.

Figure 15:
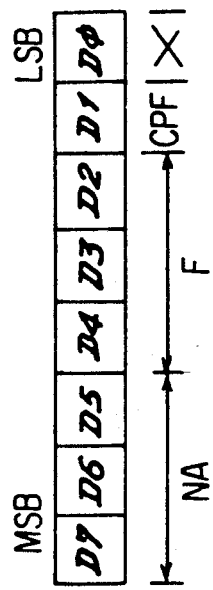
FIGS. 15A and 15B, the formats of the synthesizer's command words.
Figure 15:
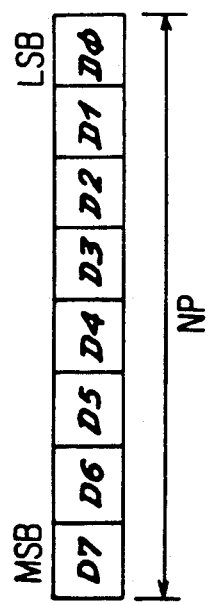

In the same way the command information for a TACAN synthesizer is constituted in this example of two words in series of 8 bits in parallel whose format is represented in FIGS. 15A and 15B.

The information contained in these two words enable the variable-rank divider 2 to be commanded directly (words NA and Np respectively on 3 and 8 bits for programming the counters 12 and 13), of the phase accumulator circuit 9 (word F on 3 bits) and the permutation of the inputs to the phase comparator (word CPF on 1 bit).

In TACAN mode the bits D0 to D4 forming the second word can all have the value 0.

The first 8-bit word is taken into account on the rising edge of the first pulse of the signal CHF1 by the register 67 under the control of a port 73. The second 8-bit word is taken into account on the rising edge of the second pulse of the signal CHF1 by a register 69 under the control of a port 74. A REGISTER SELECT signal combined with the ENABLE signal validates successively the registers 67 and 69. A buffer register 70 is validated at the same time as the register 69 in order to send the first 8-bit word simultaneously with the second word to a 16-bit input of a multiplexer 71, on the rising edge of the second pulse of the signal CHF1. To this end, the multiplexer 71 receives at its second input 16 bits, the TDMA information at output from the coding circuit 68. This has the advantage of making it possible to select, from a cabled TDMA/TACAN command, the synthesizer command information for the TDMA mode or the TACAN mode. The interface circuit also includes a sequencer 75bis, which delivers a signal CHF2 to select the second pulse of the signal CHF1 in TACAN mode. In this way the data management interface can operate for example with a clock frequency of 5 MHz.

Figure 14:
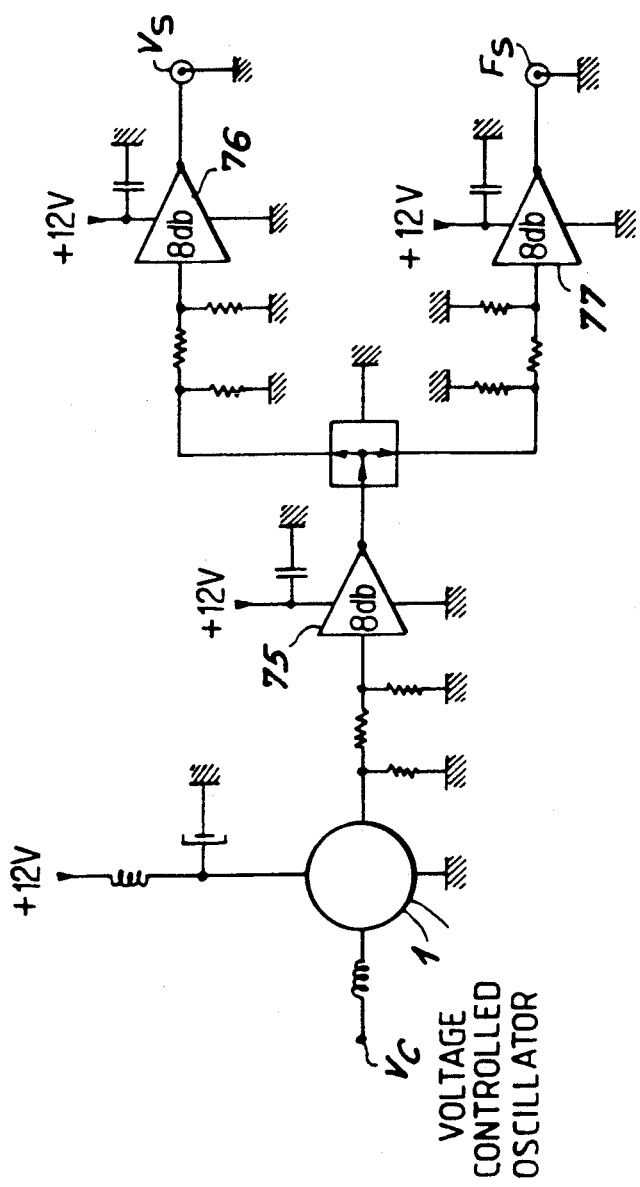
FIG. 14, the coupling of the output and loop amplifiers of the synthesizer at output from the tension-commanded oscillator in FIG. 1.

Finally the coupling of the amplifiers 3 of the output and of the loop of the synthesizer at the output from the oscillator 1 is performed as shown in FIG. 14 using amplifiers referenced 75 to 77, the amplifiers 76 and 77 separating the two channels (output and loop).

For the TDMA application, the oscillator 1 must be able to cover the 1242-1479 MHz frequency band while conserving a very linear voltage-frequency transfer characteristic to keep a constant loop gain and spectral purity performances of the synthesizer in the whole frequency range.

For a TACAN synthesizer, the oscillator must be able to cover Emission and Reception frequency bands from 1025 to 1474 MHz. The frequency range covered by this oscillator is therefore larger than that covered by the oscillator for the TDMA application, but in this case it is not necessary to have such a high linearity, as the conservation of the spectral purity performances in the frequency range is less critical. In this way, whatever the application, it is possible to obtain a noise limit less than $-150$ dBc/Hz from a frequency difference of $\pm 10\%$ of the central frequency and an oscillator output level of $\pm 13$ dBm.

What is claimed is:

1. A microwave synthesizer with fractional division comprising:
   a voltage controlled oscillator;
   a variable rank frequency divider coupled to the voltage controlled oscillator;
   a phase-frequency comparator having a first input for receiving an output signal from the variable rank frequency divider and having a second input for receiving a reference signal, wherein the phase-frequency comparator compares the frequency and the phase of the signals received at the first and second inputs;
   a control device whose output is connected to an input of the voltage controlled oscillator to control the oscillation frequency of the voltage controlled oscillator on a frequency which is a whole multiple and/or a fraction of the frequency of the reference signal depending on the rank of division of the variable-rank frequency divider; and
   a phase accumulator circuit whose output is connected to the variable-rank frequency divider to command the rank of division of the variable-rank frequency divider,
   wherein the phase-frequency comparator circuit comprises a first output UP and a second output DOWN, and sends respectively to the first output UP a first series of pulses and to the second output DOWN a second series of pulses as a function, respectively, of the phase advance or delay of the signals applied to the phase-frequency comparator's first and second inputs, the two series of pulses being sent simultaneously, in phase with each other, of the same width and in phase with the reference signal when the signals applied to the first and second inputs of the comparator are in phase, and wherein the control device comprises an integration capacitor which is charged and discharged, respectively, by the pulses of one or other of the series, to give a signal control frequency and phase advance or delay of the oscillator which is a function of the voltage developed across the terminals of the capacitor.

2. The synthesizer according to claim 1, wherein the control device includes two current sources switched by the UP and DOWN outputs of the phase-frequency comparator to charge and discharge the integration capacitor when one or other of the two series of pulses respectively is present at the output of the phase-frequency comparator.

3. The synthesizer according to claim 2, wherein the two sources of current comprise two symmetrical UP and DOWN channels each comprised of a first differential pair of transistors which performs a translation of level to command a second pair of transistors which switches the current for charge and/or discharge of the integration capacitor.

4. The synthesizer according to claim 3, wherein the control device comprises frequency rejector filters arranged between the output from the switched current sources and the integration capacitor to eliminate the parasite frequencies within the pass band of the synthesizer.

5. The synthesizer according to claim 4, wherein the variable-rank divider comprises two ranks of division N and N+1 commanded by an overflow signal from the phase-accumulator circuit.

6. The synthesizer according to claim 5, wherein the variable-rank divider comprises a first and a second programmable counter, piloted by a clock signal supplied by a predivider circuit with two dividing factors Q and Q+1 of the clock signal of frequency FS supplied by the oscillator, the two counters being loaded at the beginning of division with the respective values NA and Np and commanded to count down simultaneously from the values NA and Np during NA(Q+1) pulses until the pulse for which the content of the first counter becomes zero, and during the remaining (Np-NA)Q pulses necessary to empty the second counter, the passage from the rank of division Q+1 to the rank of division Q of the predivider circuit being commanded by the resetting of the first counter.

7. The synthesizer according to claim 6, wherein the reference frequency is obtained from a programmable reference divider.

8. The synthesizer according to claim 7, wherein the phase frequency comparator comprises a locking detection device for detecting incorrect operation of the synthesizer based on the outputs of the phase-frequency comparator.

9. The synthesizer according to claim 8, wherein the locking detection device comprises a counter, and an "exclusive OR" circuit with two inputs connected respectively to the UP and DOWN outputs from the phase-frequency comparator, wherein the counter is set to zero according to an output of the "exclusive OR" gate and incremented according to a reference clock FR.

10. The synthesizer according to claim 9, further comprising a management interface circuit for applying to the synthesizer commands indicating the whole multiple and/or fraction of the frequency of the reference signal depending on the rank of division of the variable rank frequency divider and a command for permutation of the inputs of the phase frequency comparator.

* * * * *